(12) United States Patent
Hsu

(10) Patent No.: US 9,747,206 B2
(45) Date of Patent: Aug. 29, 2017

(54) METHODS FOR REPROGRAMMING DATA AND APPARATUSES USING THE SAME

(71) Applicant: Silicon Motion, Inc., Jhubei (TW)

(72) Inventor: Che-Wei Hsu, Taiching (TW)

(73) Assignee: Silicon Motion, Inc., Jhubei (TW)

( * ) Notice: Subject to any disclaimer, the term of this patent is extended or adjusted under 35 U.S.C. 154(b) by 78 days.

(21) Appl. No.: 14/862,697

(22) Filed: Sep. 23, 2015

(65) Prior Publication Data

US 2016/0259679 A1 Sep. 8, 2016

(30) Foreign Application Priority Data

Mar. 4, 2015 (TW) ............................. 104106787 A

(51) Int. Cl.

| | | |
|---|---|---|
| *G06F 11/10* | (2006.01) | |
| *H03M 13/29* | (2006.01) | |
| *H03M 13/09* | (2006.01) | |
| *H03M 13/19* | (2006.01) | |
| *G06F 12/0802* | (2016.01) | |
| *G06F 12/02* | (2006.01) | |
| *G11C 11/56* | (2006.01) | |
| *G11C 16/04* | (2006.01) | |

(52) U.S. Cl.
CPC ...... *G06F 12/0802* (2013.01); *G06F 12/0246* (2013.01); *G11C 11/5628* (2013.01); *G06F 2212/1016* (2013.01); *G06F 2212/1032* (2013.01); *G06F 2212/1036* (2013.01); *G06F 2212/205* (2013.01); *G06F 2212/7209* (2013.01); *G06F 2212/7211* (2013.01); *G11C 16/0483* (2013.01)

(58) Field of Classification Search
CPC ............ G11C 16/3459; G11C 2213/75; G11C 2211/5641; G11C 2211/5642; G11C 16/08; G11C 16/10; G11C 11/5628; G06F 3/0601; G06F 2212/1016; G06F 2212/22
See application file for complete search history.

(56) References Cited

U.S. PATENT DOCUMENTS

| | | | |
|---|---|---|---|
| 8,225,067 B2 * | 7/2012 | Chu ................... | G06F 12/0246 711/103 |
| 2009/0164704 A1 * | 6/2009 | Kanade ............... | G06F 11/1068 711/103 |

(Continued)

FOREIGN PATENT DOCUMENTS

| | | |
|---|---|---|
| TW | 201409230 A | 3/2014 |
| WO | 2008005735 A2 | 1/2008 |

OTHER PUBLICATIONS

Corresponding Office Action of TW application published on May 24, 2016.

*Primary Examiner* — Phung M Chung
(74) *Attorney, Agent, or Firm* — Wang Law Firm, Inc.

(57) ABSTRACT

A method for reprogramming data, performed by a processing unit, is disclosed to include at least the following steps. After a page of data has failed to be programmed into a first block of a storage unit, it is determined whether the failed page is an upper page or a first lower page. When the failed page is an upper page, a host page number associated with a second lower page of a wordline including at least the failed page is obtained, a second block is selected, and an access interface is directed to reprogram data from the second lower page to the upper page into the second block.

12 Claims, 7 Drawing Sheets

(56) References Cited

U.S. PATENT DOCUMENTS

| | | |
|---|---|---|
| 2010/0318839 A1 | 12/2010 | Avila et al. |
| 2011/0209028 A1* | 8/2011 | Post .................... G06F 11/1068 714/758 |
| 2012/0314500 A1 | 12/2012 | Song et al. |
| 2013/0024743 A1* | 1/2013 | Sharon ................ G06F 11/1072 714/763 |
| 2013/0205066 A1 | 8/2013 | Dusija et al. |
| 2013/0219107 A1 | 8/2013 | Lee et al. |
| 2014/0006688 A1 | 1/2014 | Yu et al. |
| 2014/0281683 A1 | 9/2014 | Dusija et al. |
| 2015/0161001 A1* | 6/2015 | Cometti .............. G06F 11/1072 714/773 |

* cited by examiner

METHODS FOR REPROGRAMMING DATA AND APPARATUSES USING THE SAME

CROSS REFERENCE TO RELATED APPLICATIONS

The Application claims priority of Taiwan Patent Application No. 104106787, filed on Mar. 4, 2015, the entirety of which is incorporated by reference herein.

BACKGROUND

Technical Field

The present invention relates to flash memory, and in particular to methods for reprogramming data and apparatuses using the same.

Description of the Related Art

Flash memory devices typically include NOR flash devices and NAND flash devices. NOR flash devices are random access—a host accessing a NOR flash device can provide the device any address on its address pins and immediately retrieve data stored in that address on the device's data pins. NAND flash devices, on the other hand, are not random access but serial access. It is not possible to access any random address in the way described above for NOR—instead the host has to write into the device a sequence of bytes which identifies both the type of the requested command (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word. Memory cells of a flash memory may malfunction after being accessed numerous times. Particles or mask defects in manufacturing a flash memory may cause a whole wordline of a storage unit to fail. Accordingly, what is needed are methods for reprogramming data when the programming failure appears, and apparatuses using the methods.

BRIEF SUMMARY

An embodiment of a method for reprogramming data, performed by a processing unit, is disclosed to include at least the following steps. After a page of data has failed to be programmed into a first block of a storage unit, it is determined whether the failed page is an upper page or a first lower page. When the failed page is an upper page, a host page number associated with a second lower page of a wordline including at least the failed page is obtained, a second block is selected and an access interface is directed to reprogram data from the second lower page to the upper page into the second block.

An embodiment of an apparatus for reprogramming data is disclosed to include at least an access interface and a processing unit. The access interface is coupled to a storage unit and the processing unit is coupled to the access interface. The processing unit, after inspecting that a page of data has failed to be programmed into a first block of a storage unit, determines whether the failed page is an upper page or a first lower page. When the failed page is an upper page, the processing unit obtains a host page number associated with a second lower page of a wordline comprising the failed page, selects a second block and directs an access interface to reprogram data from the second lower page to the upper page into the second block.

A detailed description is given in the following embodiments with reference to the accompanying drawings.

BRIEF DESCRIPTION OF THE DRAWINGS

The present invention can be fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
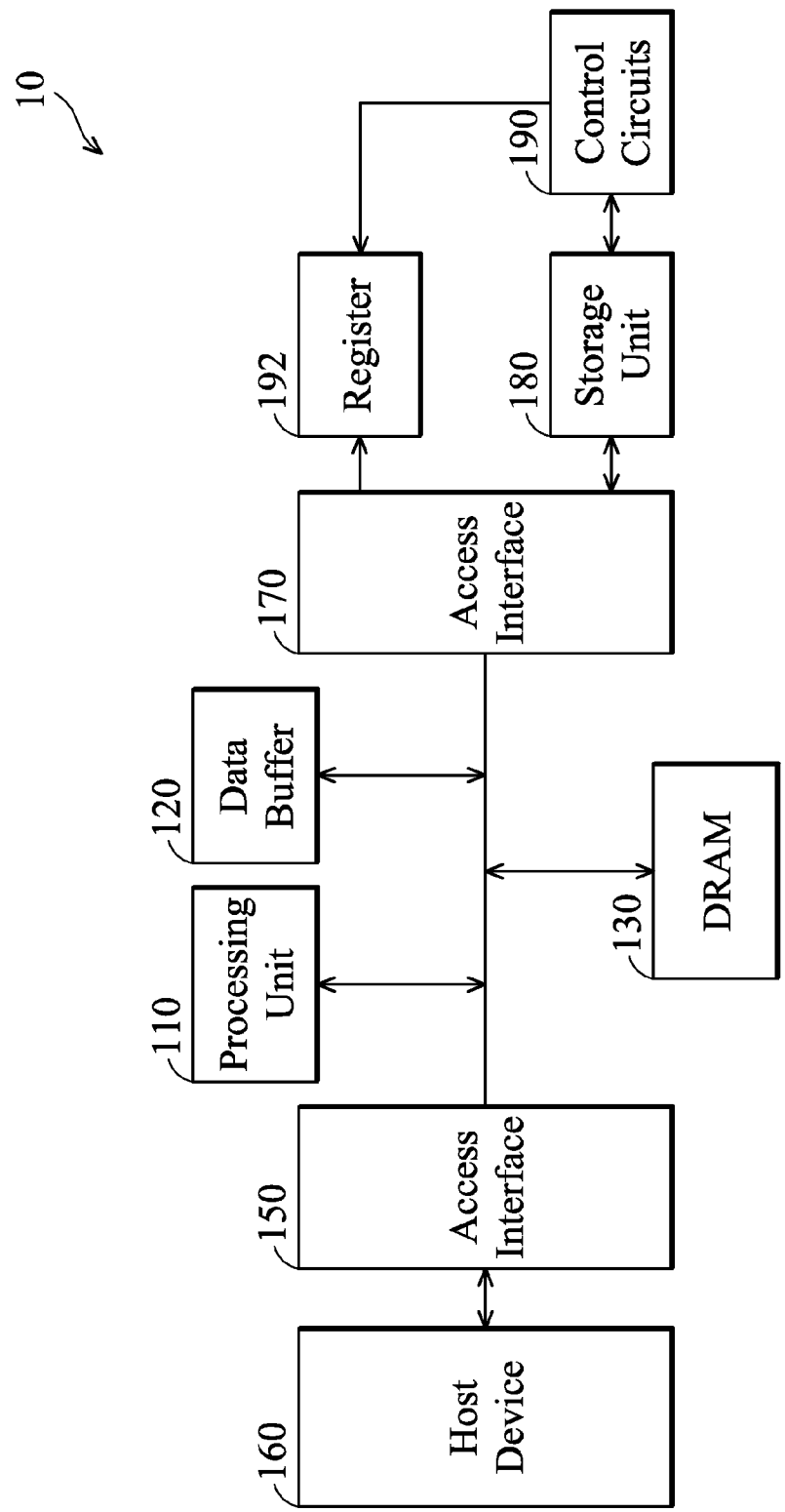
FIG. 1 is the system architecture of a flash memory according to an embodiment of the invention.

FIG. 1 is the system architecture of a flash memory according to an embodiment of the invention. The system architecture 10 of the flash memory contains a processing unit 110 being configured to write data into a designated address of a storage unit 180, and read data from a designated address thereof. Specifically, the processing unit 110 writes data into a designated address of the storage unit 180 through an access interface 170 and reads data from a designated address thereof. The system architecture 10 uses several electrical signals for coordinating commands and data transfer between the processing unit 110 and the storage unit 180, including data lines, a clock signal and control lines. The data lines are employed to transfer commands, addresses and data to be written and read. The control lines are utilized to issue control signals, such as CE (Chip Enable), ALE (Address Latch Enable), CLE (Command Latch Enable), WE (Write Enable), etc. The access interface 170 may communicate with the storage unit 180 using a SDR (Single Data Rate) protocol or a DDR (Double Data Rate) protocol, such as ONFI (open NAND flash interface), DDR toggle, or others. The processing unit 110 may communicate with other electronic devices through an access interface 150 using a standard protocol, such as USB (Universal Serial Bus), ATA (Advanced Technology Attachment), SATA (Serial ATA), PCI-E (Peripheral Component Interconnect Express) or others.

Figure 2:
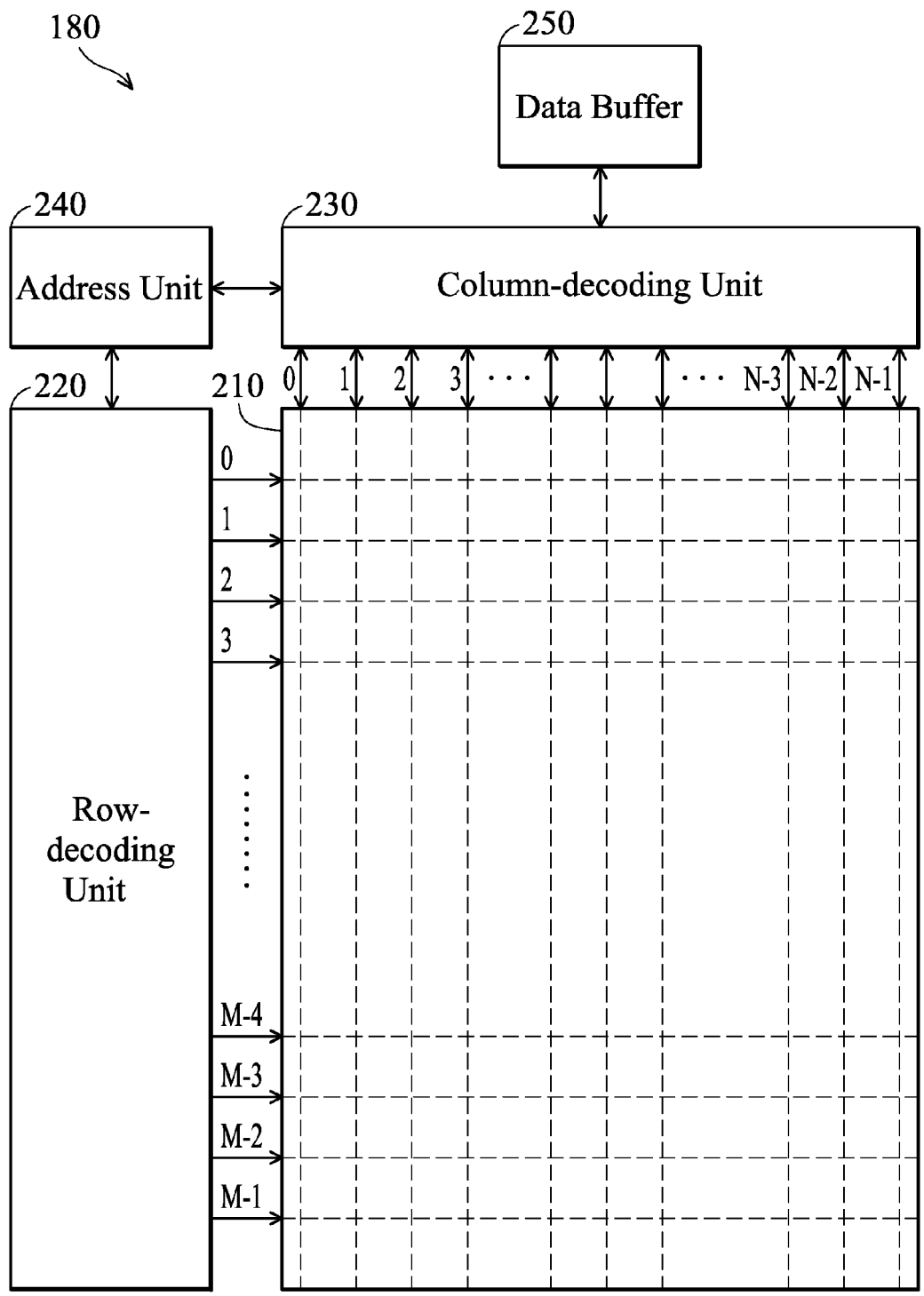
FIG. 2 shows a schematic diagram depicting a storage unit of a flash memory according to an embodiment of the invention.

FIG. 2 shows a schematic diagram depicting a storage unit of a flash memory according to an embodiment of the invention. The storage unit 180 may include an array 210 composed of M×N memory cells, and each memory cell may store at least one bit of information. The flash memory may be a NAND flash memory, etc. In order to appropriately access desired information, a row-decoding unit 220 is used to select appropriate row lines of the array 210 for access. Similarly, a column-decoding unit 230 is employed to select an appropriate number of bytes within the row for output. An address unit 240 applies row information to the row-decoding unit 220 defining which of the N rows of the memory cell array 210 is to be selected for reading or writing. Similarly, the column-decoding unit 230 receives address information defining which one or ones of the M columns of the memory cell array 210 are to be selected. Rows may be referred to as wordlines by those skilled in the art interchangeably, and columns may be referred to as bitlines interchangeably. Data read from or to be applied to the memory cell array 110 is stored in a data buffer 250. Memory cells may be MLCs (Multi-Level Cells).

Figure 3:
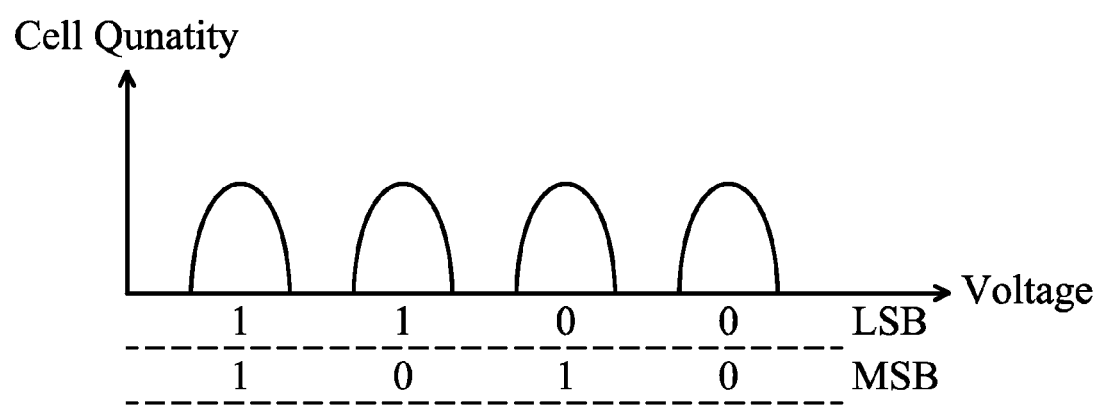
FIG. 3 is a schematic diagram illustrating a distribution of the threshold voltages of a large population of MLC cells according to an embodiment of the invention.
Figure 4:
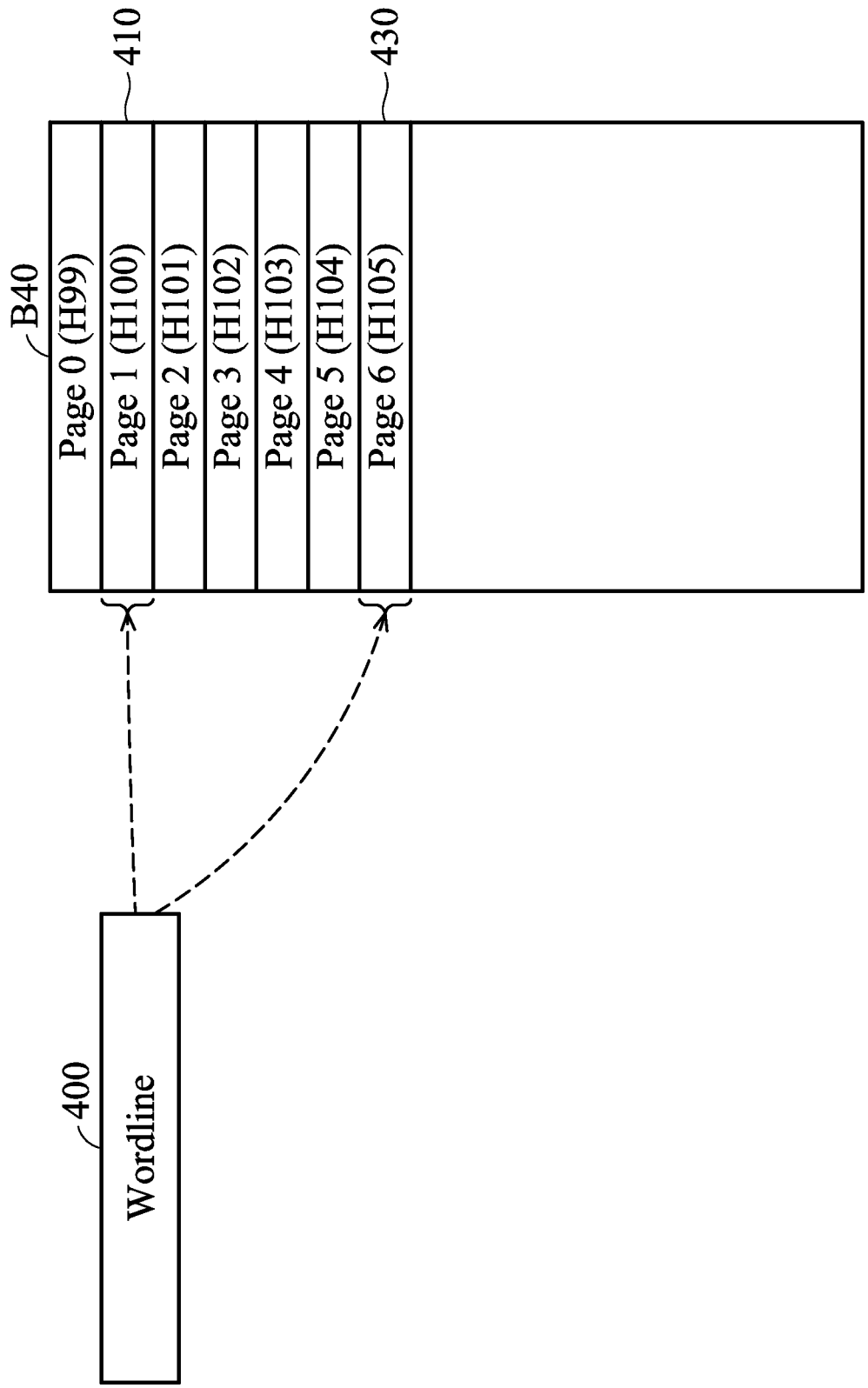
FIG. 4 is a schematic diagram illustrating an association of a physical wordline with host pages according to an embodiment of the invention.

Although an MLC literally has more than two levels, i.e. more than one bit per cell, the most common MLC at present are ones with two bits per cell, and therefore examples are given below. A single MLC storing two bits of information is in one of four different states, where one bit is designated as the LSB (Least Significant Bit) and the other is designated as the MSB (Most Significant Bit). As the "state" of a memory cell is represented by its threshold voltage, an MLC supports four different valid ranges for its threshold voltages. FIG. 3 is a schematic diagram illustrating a distribution of the threshold voltages of a large population of MLC cells according to an embodiment of the invention. As expected, it has four peaks, each peak corresponding to one state. All the LSBs of one physical wordline collectively form a lower page and all the MSBs thereof collectively form an upper page. In other words, one MLC stores values of two pages (the lower page and the upper page). FIG. 4 is a schematic diagram illustrating an association of a physical wordline with host pages according to an embodiment of the invention. For example, a wordline 400 stores values of a lower page 410 and an upper page 430, where the lower page 410 is the page 1 of a block B40 (pages are numbered from zero) and the upper page 430 is the page 6 of the block B40. The lower page 410 stores data of a host page H100 sent from a host device 160 and the upper page 430 stores data of a host page H105 sent from the host device 160. Each host page contains storage space identified by a successive number of logical block addresses, such as LBA0 to LBA7, and each logical block address corresponds to a fixed-size physical storage space, such as 256K, 512K or 1024K bytes.

The host device 160 may transmit write commands, write addresses and data to the processing unit 110 via the access interface 150. The processing unit 110 stores the data to be written in a DRAM (Dynamic Random Access Memory) 130. Each time the storage unit 180 is programmed, the processing unit 110 obtains relevant data from the DRAM 130, stores the data in a data buffer 120 and directs the access interface 170 to program data of the data buffer 120 into the storage unit 180 page by page. The data buffer 120 may be implemented in a SRAM (Static Random Access Memory). After one page of data has been programmed into the storage unit 180, control circuits 190 inspect whether this programming is successful and accordingly set a register 192 to notify the processing unit 110 an execution outcome. When discovering a program fail via the register 192, the processing unit 110 performs a reprogramming procedure to program the same values into the storage unit 180 again.

Figure 5:
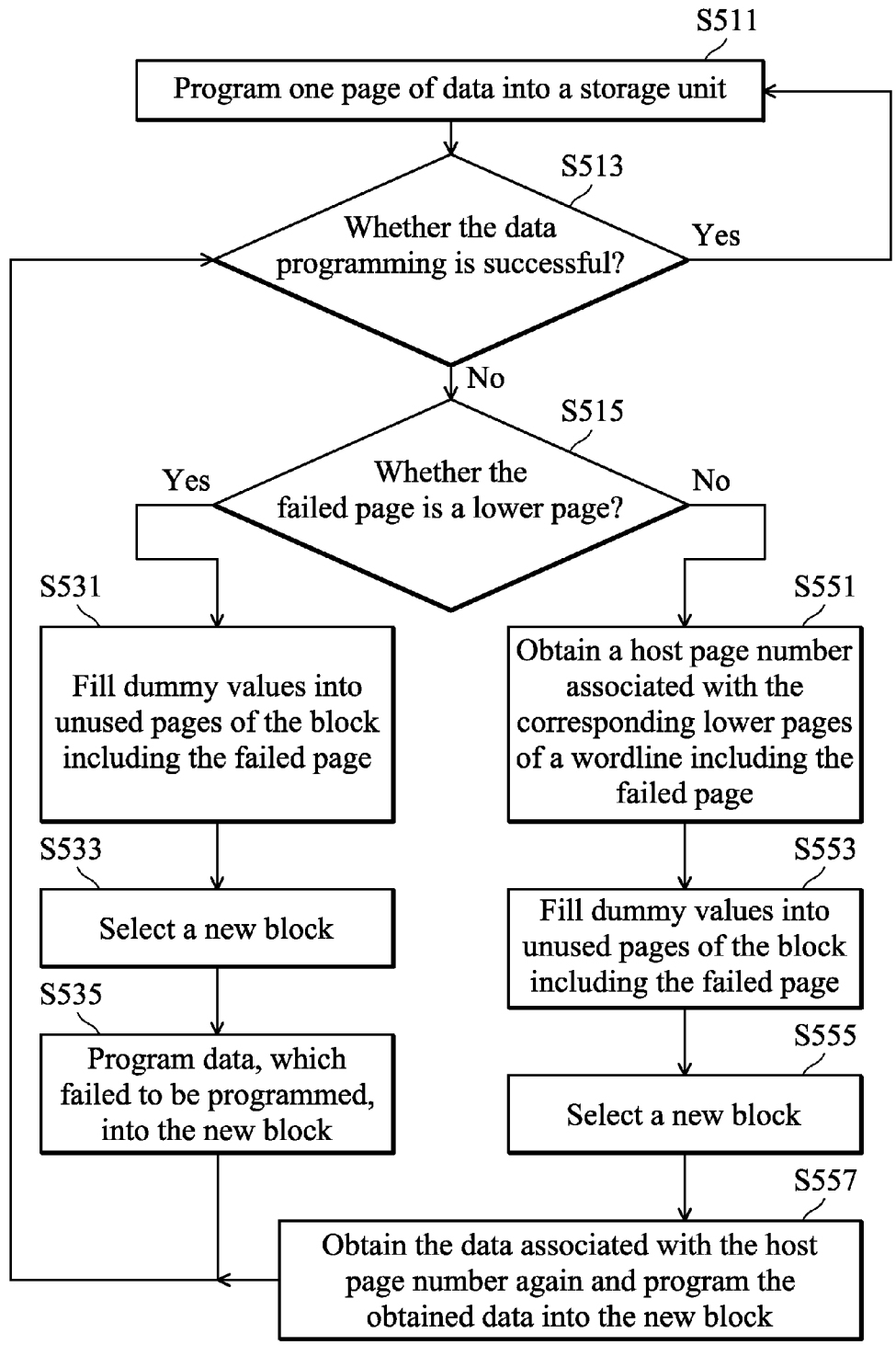
FIG. 5 is a flowchart illustrating a method for programming data, performed by a processing unit, according to an embodiment of the invention.

FIG. 5 is a flowchart illustrating a method for programming data, performed by a processing unit, according to an embodiment of the invention. Each time one page of data is programmed into the storage unit 180 (step S511), the processing unit 110 may inspect the settings of the register 192 to determine whether the data programming is successful (step S513). When the data programming fails (the "No" path of step S513), a data reprogramming procedure is performed (steps S515 to S557). During the data reprogramming procedure, the processing unit 110 performs different processes according to the failed page types (e.g. a lower page and an upper page).

Figure 6:
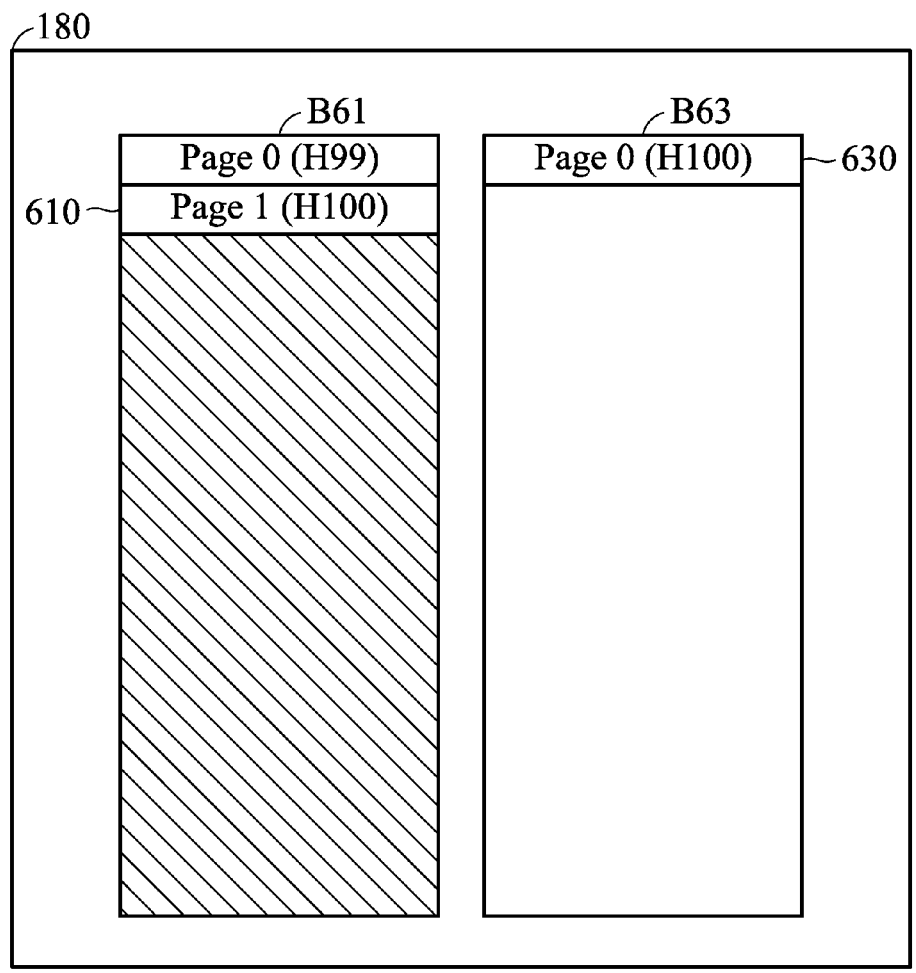
FIG. 6 is a schematic diagram illustrating a data reprogramming for a lower page.

When the failed page is a lower page (the "Yes" path of step S515), the processing unit 110 fills dummy values into unused pages of the block including the failed page (step S531), selects a new block (also referred to as an active block) (step S533) and programs the data, which failed to be programmed, into the new block (step S535). FIG. 6 is a schematic diagram illustrating a data reprogramming for a lower page. When attempting to program data of a host page H100 into the page 1 610 (a lower page) of the block B61 but failed, the used pages of the block B61 (as shown in slashes) are filled with dummy values (step S531). Next, a new block B63 is selected (step S533) and the data of the host page H100 is programmed into the page 0 630 of the block B63 (step S535). It should be understood that, after the data of the host page H100 has been successfully programmed into the new block, the processing unit 110 sets the physical storage location associated with the host page H100, which is stored in a storage mapping table (also referred to as a H2F Host-to-Flash table), to point to the page 0 630 of the block B63. That is, when the host device 160 issues a read command to read the data of the host page H100, the processing unit 110 will not read data from the page 610.

Figure 7:
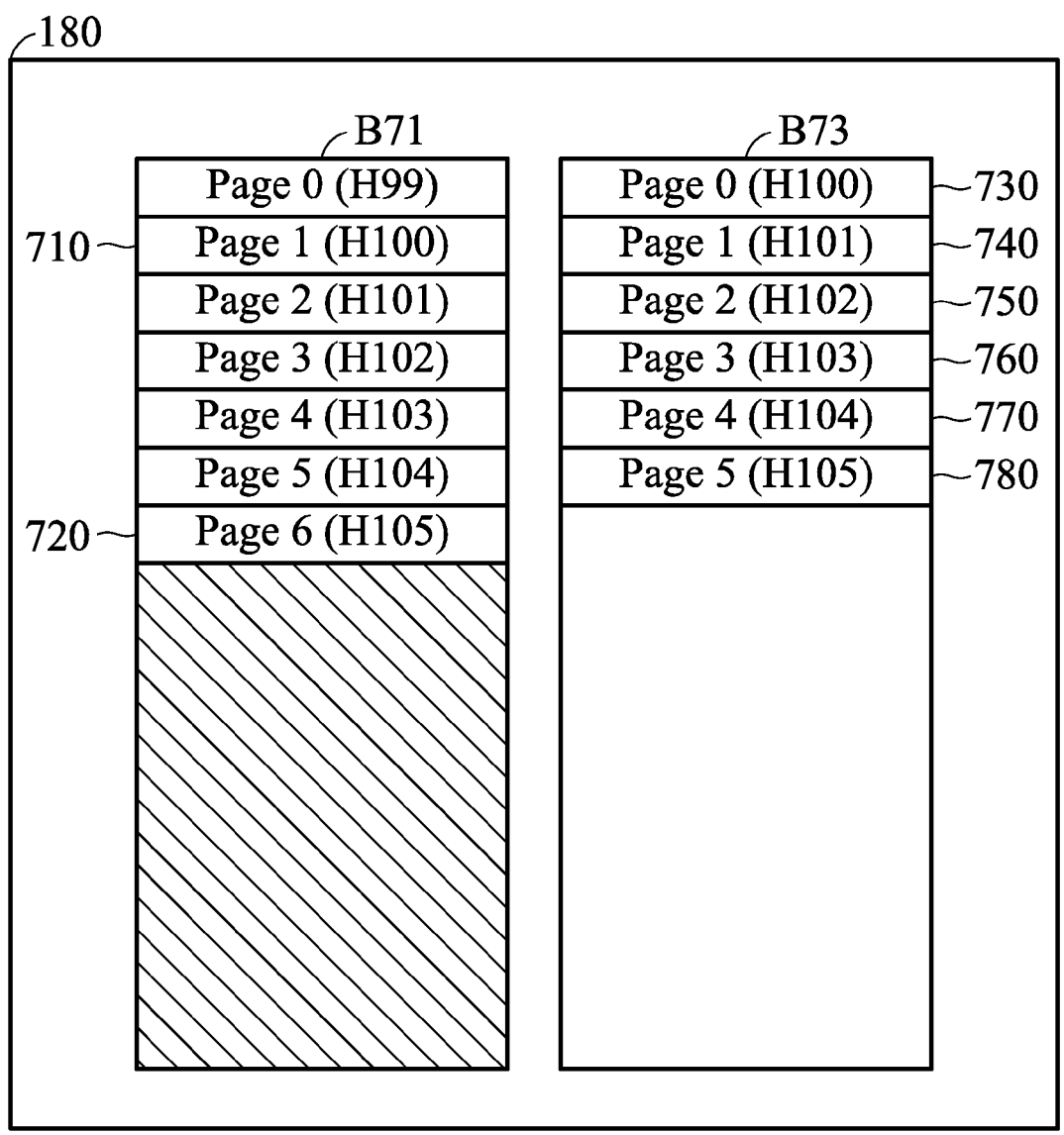
FIG. 7 is a schematic diagram illustrating a data reprogramming for an upper page.

When the failed page is an upper page (the "No" path of step S515), not only does the data of this page suffer, but also the corresponding lower page of the same wordline. Thus, the processing unit 110 obtains a host page number associated with the corresponding lower pages of a wordline including the failed page (step S551) and fills dummy values into unused pages of the block including the failed page (step S553). Then, the processing unit 110 selects a new block (step S555), obtains the data associated with the host page number again and programs the obtained data into the new block (step S557). In step S557, the processing unit 110 may read the data associated with the host page number from the DRAM 130, store the read data in the data buffer 120 and direct the access interface 170 to read the data of the data buffer 120 and program the read data into the new block of the storage unit 180. FIG. 7 is a schematic diagram illustrating a data reprogramming for an upper page. When an attempting to program data of a host page H105 into the page 6 720 (an upper page) of the block B71 fails, the host page number H100 of the lower page 710 of a wordline including the failed page is obtained (step S551) and the used pages of the block B71 (as shown in slashes) are filled with dummy values (step S553). Next, a new block B73 is selected (step S555) and the data of the host page H100 is obtained again and programmed into the page 0 730 of the block B73 (step S557). In regular situations, step S511 is repeatedly performed to program the data of the host pages H101 to H105 into page 1 740 to page 5 780 of the block B73. It should be understood that, after the data of the host pages H100 to H105 has been successfully programmed into the new block, the processing unit 110 sets the physical storage locations associated with the host pages H100 to H105, which are stored in a storage mapping table (also referred to as a H2F Host-to-Flash table), to point to the page 0 730 to the page 5 780 of the block B73, respectively.

Each time the reprogramming procedure ends, no matter for a lower page or an upper page, the processing unit 110 determines whether the data reprogramming is successful (step S513) and performs relevant processes accordingly.

Although the embodiment has been described as having specific elements in FIGS. 1 and 2, it should be noted that additional elements may be included to achieve better performance without departing from the spirit of the invention. While the process flow described in FIG. 5 includes a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for reprogramming data, performed by a processing unit, comprising:
    after inspecting that a page of data has failed to be programmed into a first block of a storage unit, determining, by the processing unit, whether the failed page is an upper page or a first lower page of the first block;
    determining, by the processing unit, whether the page of data has failed to be programmed into the first block of the storage unit;
    when the failed page is the upper page of the first block, obtaining, by the processing unit, a host page number associated with a second lower page of a plurality of memory cells of the first block of a wordline, wherein the memory cells comprises the failed page;
    when the failed page is the upper page of the first block, selecting, by the processing unit, a second block of the storage unit; and
    when the failed page is the upper page of the first block, directing, by the processing unit, an access interface to reprogram data from the second lower page to the upper page of the first block into the second block of the storage unit, wherein at least one intermediate page is present between the second lower page and the upper page of the first block, and the second lower page, the intermediate page and the upper page are associated with consecutive host page numbers,
    wherein the step for determining whether the page of data has failed to be programmed into the first block of the storage unit further comprises
    inspecting, by the processing unit, a register through the access interface to determine whether the page of data has failed to be programmed into the first block of the storage unit, wherein the register is set by control circuits to notify the processing unit an execution outcome associated with a programming of the page of data.

2. The method of claim 1, wherein each memory cell stores information of a LSB (Least Significant Bit) and a MSB (Most Significant Bit), the LSBs of the memory cells collectively form the second lower page of the first block and the MSBs of the memory cells collectively form the upper page of the first block.

3. The method of claim 1, further comprising:
    when the failed page is the upper page of the first block, reading, by the processing unit, data associated with the consecutive host page numbers from a DRAM (Dynamic Random Access Memory) and storing the read data in a data buffer; and
    when the failed page is the upper page of the first block, directing the access interface to program the data of the data buffer into the second block.

4. The method of claim 1, further comprising:
    when the failed page is the first lower page of the first block, selecting, by the processing unit, the second block; and
    when the failed page is the first lower page of the first block, directing, by the processing unit, the access interface to program data of the first lower page into the second block.

5. The method of claim 1, further comprising:
    filling, by the processing unit, unused pages of the first block with dummy values.

6. The method of claim 1, further comprising:
    setting, by the processing unit, a physical storage location associated with the host page number, which is stored in a storage mapping table, to point to the second block.

7. An apparatus for reprogramming data, comprising:
    an access interface, coupled to a storage unit; and
    a processing unit, coupled to the access interface, the processing unit,
        after inspecting that a page of data has failed to be programmed into a first block of a storage unit, determining whether the failed page is an upper page or a first lower page of the first block;
        determining whether the page of data has failed to be programmed into the first block of the storage unit;
        inspecting a register setting through the access interface to determine whether the page of data has failed to be programmed into the first block of the storage unit;
        when the failed page is the upper page of the first block, obtaining a host page number associated with a second lower page of a plurality of memory cells of the first block of a wordline, selecting a second block of the storage unit and directing an access interface to reprogram data from the second lower page to the upper page of the first block into the second block of the storage unit,
    wherein the memory cells comprises the failed page, at least one intermediate page is present between the second lower page and the upper page of the first block, and the second lower page, the intermediate page and the upper page are associated with consecutive host page numbers, wherein the register is set by control circuits to notify the processing unit an execution outcome associated with a programming of the page of data.

8. The apparatus of claim 7, wherein each memory cell stores information of a LSB (Least Significant Bit) and a MSB (Most Significant Bit), the LSBs of the memory cells collectively form the second lower page of the first block and the MSBs of the memory cells collectively form the upper page of the first block.

9. The apparatus of claim 7, wherein when the failed page is the upper page of the first block, the processing unit reads data associated with the consecutive host page numbers from a DRAM (Dynamic Random Access Memory), stores the read data in a data buffer and directs the access interface to program the data of the data buffer into the second block.

10. The apparatus of claim 7, wherein when the failed page is the first lower page of the first block, the processing unit selects the second block and directs the access interface to program data of the first lower page into the second block.

11. The apparatus of claim 7, wherein the processing unit further fills unused pages of the first block with dummy values.

12. The apparatus of claim 7, wherein the processing unit further sets a physical storage location associated with the host page number, which is stored in a storage mapping table, to point to the second block.

* * * * *